(12) United States Patent
Nakagawa et al.

(10) Patent No.: US 6,725,513 B2
(45) Date of Patent: Apr. 27, 2004

(54) METHOD FOR MANUFACTURING SURFACE ACOUSTIC WAVE APPARATUS

(75) Inventors: Masatoshi Nakagawa, Ishikawa-ken (JP); Makoto Tose, Moriyama (JP); Yoshihiro Koshido, Kanazawa (JP); Koji Fujimoto, Otsu (JP); Takeshi Nakao, Nagaokakyo (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/875,216

(22) Filed: Jun. 6, 2001

(65) Prior Publication Data

US 2002/0157224 A1 Oct. 31, 2002

(30) Foreign Application Priority Data

Jul. 5, 2000 (JP) ......................................... 2000-204270

(51) Int. Cl.[7] .......................... H04R 17/00; H05K 3/20; H05K 3/02; H01L 41/04
(52) U.S. Cl. .......................... 29/25.35; 29/831; 29/847; 310/311
(58) Field of Search .............................. 29/25.35, 831, 29/847, 743, DIG. 16, DIG. 21, DIG. 24; 310/311, 320, 323.06, 367

(56) References Cited

U.S. PATENT DOCUMENTS

| | | | | | |
|---|---|---|---|---|---|
| 3,878,079 | A | * | 4/1975 | Schauer ................. | 204/192.15 |
| 5,221,449 | A | * | 6/1993 | Colgan et al. ......... | 204/192.15 |
| 5,605,561 | A | * | 2/1997 | Iwabuchi et al. ............. | 75/364 |
| 5,815,900 | A | * | 10/1998 | Ichikawa et al. ........... | 29/25.35 |
| 5,847,486 | A | * | 12/1998 | Kadota et al. .......... | 310/313 R |
| 6,369,491 | B1 | * | 4/2002 | Nakagawa et al. ..... | 310/313 R |
| 6,377,138 | B1 | * | 4/2002 | Takagi et al. ........... | 310/313 B |

FOREIGN PATENT DOCUMENTS

| | | | |
|---|---|---|---|
| JP | 62-297892 | | 12/1987 |
| JP | 8-125485 | | 5/1996 |
| JP | 08-125485 | * | 5/1996 .......... H03H/9/145 |
| JP | 10-247835 | * | 9/1998 .......... H03H/9/145 |

* cited by examiner

Primary Examiner—Carl J. Arbes
Assistant Examiner—T. Phan

(57) ABSTRACT

A method for manufacturing a surface acoustic wave apparatus decreases a specific resistance of an electrode film by removing hydrogen occluded in the electrode film that is primarily composed of tantalum, so that the device properties are stabilized. An electrode film primarily composed of tantalum is formed on a piezoelectric substrate. Subsequently, this electrode film is heat-treated in a vacuum at a temperature of about 200° C. to about 700° C. for several hours. Thereafter, the electrode film is patterned so as to produce an interdigital electrode transducer.

21 Claims, 3 Drawing Sheets

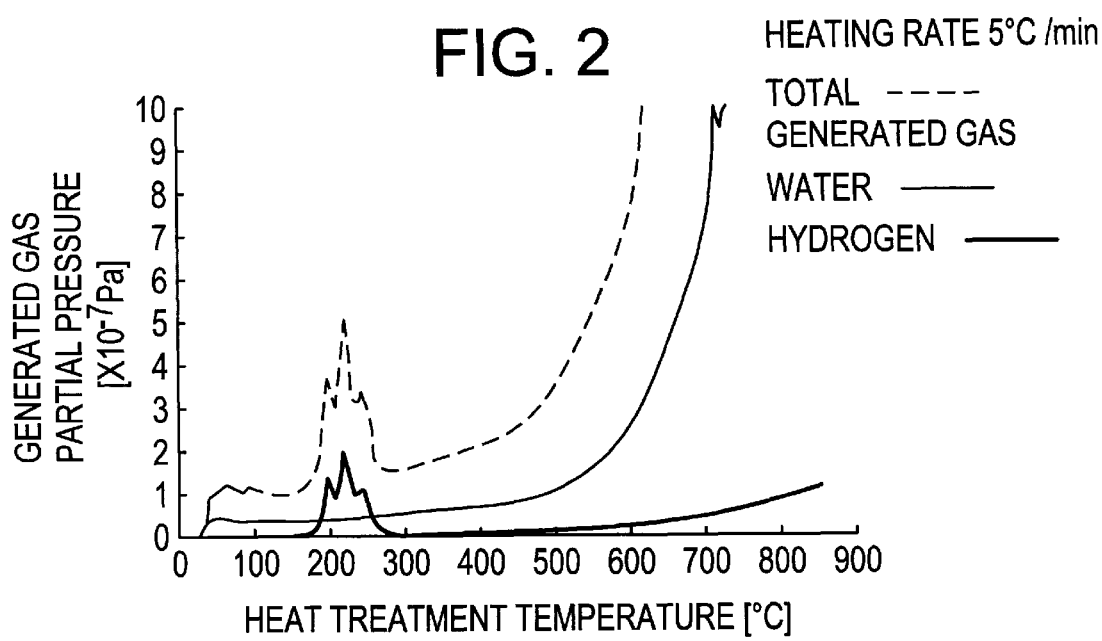
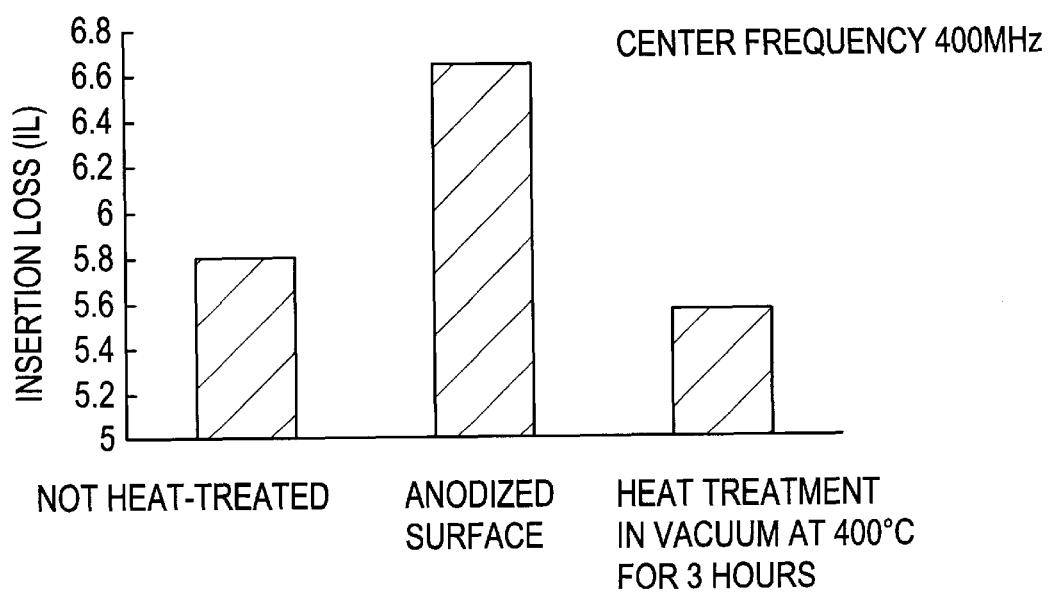

METHOD FOR MANUFACTURING SURFACE ACOUSTIC WAVE APPARATUS

BACKGROUND OF THE INVENTION

1. Field of the Invention

The present invention relates to a method for manufacturing a surface acoustic wave apparatus, and more particularly, the present invention relates to improvements in properties of an electrode film included in a surface acoustic wave apparatus for use as, for example, a resonator and a filter.

2. Description of the Related Art

Regarding electronic apparatuses, increases in frequencies and improvements in functions and performances have been accelerated. In addition, devices included in the electronic apparatuses have also been required to have increases in frequencies and improvements in functions and performances. In addition, techniques for manufacturing such a device having high quality functions and performances at lower cost have been also intensely required.

Regarding the surface acoustic wave apparatus using a surface acoustic wave, apparatuses using Rayleigh waves and apparatuses using Love waves are known. These surface acoustic wave apparatuses are manufactured by a method including the steps of forming electrode films by vapor deposition on piezoelectric substrates made of quartz or $LiNbO_3$, and subsequently, by patterning the electrode films into predetermined electrode shapes via photolithographic etching so as to form interdigital electrode transducers on the substrates. Thereafter, the device properties and characteristics of the surface acoustic wave apparatuses are evaluated.

In these two surface acoustic wave apparatuses, the surface acoustic wave apparatuses using Rayleigh waves have been widely used. As the electrode films, aluminum films made of aluminum or aluminum with copper additives, have been primarily used. With surface acoustic wave apparatuses using Rayleigh waves, however, it is difficult to miniaturize the devices due to small electromechanical coupling coefficients, small reflection coefficients, and other factors.

The aforementioned defects of the surface acoustic wave apparatuses using Rayleigh waves have been overcome by surface acoustic wave apparatuses using Love waves. With surface acoustic wave apparatuses using Love waves, as the materials for the electrode films, gold, tantalum, and tungsten, each having a high density, have been used. In surface acoustic wave apparatuses, the device properties must be stabilized, so that the stability and the reliability of the electrode films are improved. Therefore, among the aforementioned materials used for forming the electrodes, tantalum is used in many surface acoustic wave apparatuses using Love waves.

In conventional surface acoustic wave apparatuses using tantalum for the electrode films, the device properties, such as resonant frequencies, vary with time due to changes in specific resistances of the tantalum electrode films. The changes in the device properties are also caused by the thermal loads occurring during the passage through reflow furnaces after the surface acoustic wave apparatuses are manufactured.

Regarding the surface acoustic wave apparatus used as a resonator and a filter, the change in the resonant frequency is fatal, and when the change exceeds standards, the product is determined to be defective. As a consequence, in the manufacture of the surface acoustic wave apparatus, there are problems with preventing the device properties, such as the resonant frequency, from changing during the various manufacturing steps, and there are problems with improving the reliability of the surface acoustic wave apparatus.

As a method for stabilizing the specific resistance of the tantalum electrode film, the method in which the surface of the electrode film is covered with an anodized film is known.

Regarding tantalum, two kinds of tantalum, i.e., α tantalum and β tantalum, are present depending on the difference in the crystal structures. In these two types of tantalum, β tantalum is a superior resistive material exhibiting small changes in resistivity over time. On the other hand, it is reported in "Sputter Thin Film: Foundation and Application" by Haruhiro Kobayashi, published by THE NIKKAN KOGYO SHIMBUN, LTD., that α tantalum has a small specific resistance compared to that of β tantalum, although the temperature stability of the resistivity is inferior and the adhesion force relative to the substrate is also inferior.

Therefore, β tantalum exhibiting superior stability was used as the resistive material for an electrode, the electrode film made of β tantalum was covered with an anodized film, and subsequently, the electrode film was subjected to a heat treatment in order to diffuse oxygen in air, and in order to prevent a distortion status of the electrode film from changing due to the heating of a resistor. As a method for oxidizing the surface of the electrode film made of β tantalum, a method in which a heat treatment is performed in air for oxidization, and a method in which a laser light is used for the oxidization are also known.

Even when the aforementioned method was applied, in which the electrode film was covered with the oxidized film, the stability of the device properties was insufficient in practice. Furthermore, when the tantalum electrode film was covered with the anodized film, the specific resistance property was stabilized, although the value of the specific resistance was increased. As a consequence, the device properties were degraded, and the bonding performance was degraded. In addition, regarding the method in which the electrode film was covered with the anodized film, there were problems in that the process became complicated, and the cost of manufacturing the surface acoustic wave apparatus was expensive. Regarding the method in which the oxidation was performed in air, the efficiency of the manufacture was decreased due to a large time consumption, and regarding the method in which the laser light was used, the cost of the apparatus was expensive.

Accordingly, regarding surface acoustic wave apparatuses using tantalum for the electrode film, a method for manufacturing a stable electrode film at a low cost without degradation of the bonding performance and the specific resistance of the electrode film has been required but never developed.

SUMMARY OF THE INVENTION

In order to overcome the problems described above, preferred embodiments of the present invention provide a method for manufacturing a surface acoustic wave apparatus, in which a specific resistance of an electrode film is decreased, so that device properties and a bonding performance are excellent, and a stable electrode film can be manufactured with an inexpensive and simple process.

According to a preferred embodiment of the present invention, a method for manufacturing a surface acoustic wave apparatus preferably includes the steps of forming an electrode film including tantalum on a piezoelectric substrate in a vacuum, working the electrode film into a desired shape, and heat-treating the resulting electrode film at a temperature of from about 200° C. to about 700° C.

Regarding the aforementioned surface acoustic wave apparatus, by forming the electrode film that is preferably primarily composed of tantalum on the piezoelectric substrate, and subsequently, by heat-treating the resulting electrode film at a temperature of from about 200° C. to about 700° C., hydrogen occluded in the electrode film is removed. By removing the hydrogen from the electrode, the specific resistance of the electrode film is greatly decreased compared to that before the heat treatment, the stability and the reliability of the electrode film is greatly improved, and a highly reliable and low cost surface acoustic wave apparatus is produced.

When the heat treatment temperature exceeds about 700° C., the effect of decreasing the specific resistance is hardly improved with the increase in the heat treatment temperature, and the piezoelectric substrate may be warped due to an increase in the stress on the electrode film. In order to produce the effect of decreasing the specific resistance due to the heat treatment, the heat treatment must be performed at a temperature of about 200° C. or more, and the heat treatment is preferably performed at a temperature of about 300° C. or more. Therefore, the heat treatment temperature of the tantalum electrode film is preferably within a range from about 200° C. to about 700° C., and more preferably, is within a range from about 300° C. to about 700° C.

Regarding the aforementioned method for manufacturing the surface acoustic wave apparatus according to a preferred embodiment of the present invention, the step of heat-treating is preferably performed in a vacuum or in an atmosphere not containing oxygen.

When the heat treatment is performed in a vacuum or in an atmosphere not containing oxygen, for example, in an atmosphere of an inert gas, the electrode film can be prevented from being oxidized, and the resistance of the electrode film can be prevented from being increased.

Regarding the aforementioned method for manufacturing the surface acoustic wave apparatus according to a preferred embodiment of the present invention, at least a part of the tantalum, as the primary component of the electrode film, is preferably composed of α tantalum.

Regarding tantalum, there are α tantalum and β tantalum, and both types of tantalum can be used for the electrode film. In particular, by using α tantalum, the specific resistance of the electrode film can be further decreased.

Regarding the aforementioned method for manufacturing the surface acoustic wave apparatus according to preferred embodiments of the present invention, the aforementioned step of heat-treating may be performed prior to the aforementioned step of working the electrode film.

Regarding the aforementioned method for manufacturing the surface acoustic wave apparatus according to preferred embodiments of the present invention, the aforementioned step of heat-treating may be performed between the step of working the electrode film and a step of evaluating properties of the surface acoustic wave apparatus.

The timing of the heat treatment of the electrode film may be prior to the step of working the electrode film into a desired shape, and may be after the step of working the electrode film into a desired shape. When the heat treatment is performed prior to the step of working, the specific resistance can be decreased compared to that in the case in which the heat treatment is performed after the step of working. When the heat treatment is performed after the step of working, the reliability of the electrode film is improved compared to that in the case in which the heat treatment is performed prior to the step of working. In addition, when the heat treatments are performed prior to the step of working and after the step of working, the specific resistance may be further decreased and the reliability is further improved.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 2 is a diagram showing results of thermal desorption analysis regarding relationships between heat treatment temperatures and each of a total amount of generated gases, an amount of hydrogen, and an amount of water, each desorbed from a tantalum electrode film;

FIG. 3 is a diagram showing measurement results of insertion losses of surface acoustic wave filters using each of a tantalum electrode film that is not heat-treated, a tantalum electrode film covered with an anodized film, and a tantalum electrode film that is heat-treated in a vacuum.

DETAILED DESCRIPTION OF PREFERRED EMBODIMENTS

Figure 1A:
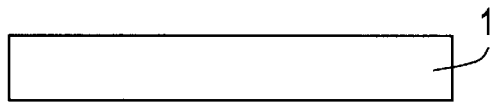
FIGS. 1A to 1G are diagrams for illustrating the steps of a method of manufacturing a surface acoustic wave apparatus according to a preferred embodiment of the present invention.

A preferred embodiment according to the present invention will be explained below with reference to FIGS. 1A to 1G. First, as shown in FIG. 1A, a substrate made of, for example, commercially available $LiTaO_3$, $LiNbO_3$, $Li_2Bi_4O_7$, quartz, and piezoelectric ceramic materials, is preferably prepared as a piezoelectric substrate 1. The surface of the piezoelectric substrate 1 is cleaned by a wet cleaning using a neutral detergent, an alcohol, or by a dry cleaning using an oxygen plasma, or other suitable material.

Figure 1B:
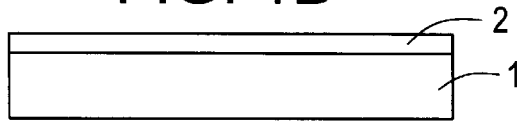

Next, as shown in FIG. 1B, an electrode film 2 made of tantalum or primarily made of tantalum is preferably formed on the entire surface of the piezoelectric substrate 1 in a vacuum. In order to form the electrode film 2 on the piezoelectric substrate 1, in general, a vacuum evaporation apparatus is used, although a sputtering apparatus, a CVD apparatus, or other suitable apparatus, may be used. The electrode film 2 may be a single-layer film made of tantalum only, although the electrode film 2 may be a multi-layer film in which a substrate layer is formed of other metallic material on the bottom surface of the tantalum layer.

Figure 1C:
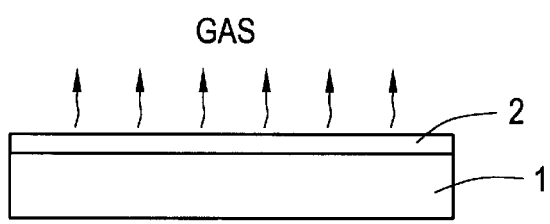

After the tantalum electrode film 2 is formed, as shown in FIG. 1C, the piezoelectric substrate 1 is heat-treated in a vacuum so as to subject the electrode film 2 to a degasification treatment. The heat treatment conditions are preferably, for example, a treatment temperature of about 400° C., a treatment time of approximately 3 hours, and a heat treatment pressure of about $1.0 \times 10^{-1}$ Pa.

Figure 1D:
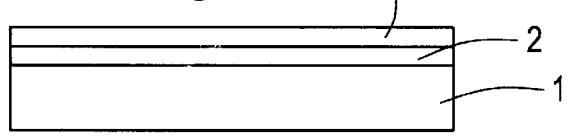
Figure 1E:
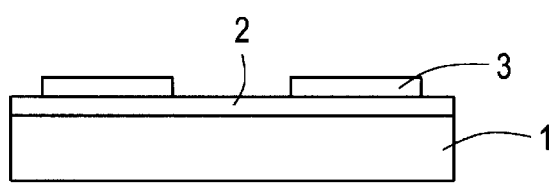

After the heat treatment is performed, as shown in FIG. 1D, a resist film 3 is formed on the entire surface of the piezoelectric substrate 1. As the resist film 3, either a commercially available negative-type photoresist or a commercially available positive-type photoresist may be used. The resist film 3 is covered with a patterning mask, the exposure is performed with an exposure apparatus, and the development is performed with a development apparatus, so that the resist film 3 is patterned into a predetermined pattern as shown in FIG. 1E. The patterned resist film 3 is dried and hardened.

Figure 1F:
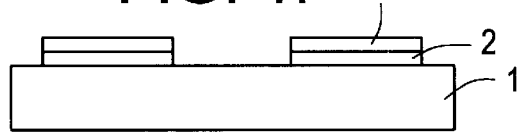
Figure 1G:

Subsequently, as shown in FIG. 1F, a region of the electrode film 2 exposing out of the resist film 3 is selectively removed by an etching using an etchant capable of etching the electrode film 2, so that the electrode film 2 is patterned and an interdigital electrode transducer is formed. Thereafter, as shown in FIG. 1G, the resist film 3 on the electrode film 2 is removed so as to expose the interdigital electrode transducer. The method for etching the electrode film may be a wet etching or a dry etching using the plasma.

After the surface acoustic wave apparatus is manufactured as described above, transmission characteristics of an element portion are verified, that is, it is verified that a predetermined frequency is available. When the availability of the predetermined frequency is verified, the surface acoustic wave apparatuses are transferred one after another to an area for performing a step of assembling, and are mounted, for example, in packages, so that the manufacturing process is completed.

FIG. 2 is a diagram showing measurement results based on a thermal desorption analysis regarding relationships between heat treatment temperatures in the step of heat-treating the tantalum electrode film disposed on the piezoelectric substrate, as described above, and degasification of the electrode film. In FIG. 2, an axis of abscissas indicates heat treatment temperatures, and an axis of ordinates indicates changes in each of a total amount of generated gases desorbed from the electrode film heated at a heating rate of about 5° C./min, an amount of hydrogen contained therein, and an amount of water contained therein, each on a partial pressure basis. As is clear from FIG. 2, regarding the total generated gases and the water, an effect of degassing increases with increases in the heat treatment temperature. Regarding the partial pressure of the hydrogen gas, three peaks are observed between about 150° C. and about 290° C.

Tantalum has the tendency to occlude hydrogen, and this hydrogen affects device properties and causes the properties to be unstable. In order to desorb this hydrogen, as is clear from FIG. 2, a heat treatment temperature of about 290° C. or more may be appropriate since the maximum temperature at which the desorption of the hydrogen is observed is about 290° C. Even when the heat treatment temperature is about 290° C. or less, the effect of removing hydrogen by the heat treatment can be exhibited if the treatment time is increased.

Table 1 shows changes in the specific resistance and the amounts of change in resonant frequency during a humidity test for 2000 hours regarding tantalum electrode films that are not heat-treated and that are heat-treated at heat treatment temperatures of about 150° C. to about 750° C. Each step of heat-treating was performed prior to a step of patterning the electrode film, and each heat treatment was performed for approximately 3 hours. A value in an upper column of each item indicates the value in the case in which β tantalum is used as the electrode film, and a value in a lower column indicates the value in the case in which α tantalum is used. The humidity test was performed using a resonator with a center frequency of approximately 400 MHzaa band at a temperature of about 85° C. and at a humidity of about 85%.

TABLE 1

| Heat Treatment Temperature (° C.) | Not Heat-treated | 150 | 200 | 300 | 400 | 500 | 600 | 700 | 750 |
|---|---|---|---|---|---|---|---|---|---|
| Change in Resistance (%) | 0 | 0.01 | −1.12 | −2.36 | −2.71 | −3.97 | −4.10 | −5.40 | −4.20 |
|  | 0 | −0.04 | −2.11 | −3.76 | −3.94 | −4.45 | −5.38 | −5.39 | −5.23 |
| Humidity Test (2000 h) Amount of Change in Resonant Frequency (ppm) | +27 | +18 | +9 | +8 | +7 | +8 | +6 | +4 | +3 |
|  | +39 | +7 | +6 | +6 | +4 | +5 | +4 | +2 | +3 |

Upper column: β Ta
Lower column: α Ta
Heat treatment time: 3 hours
Humidity test: 85° C., 85%
Central frequency: 400 MHz band
Step of heat-treating: prior to the step of patterning As is shown in Table 1, an effect of decreasing the specific resistance of the electrode film tends to increase with an increase in the heat treatment temperature. When the heat treatment temperature was about 700° C. or more, however, further enhancement of the effect was hardly recognized. Furthermore, when the heat-treating temperature exceeds about 700° C., since the stress on the tantalum electrode film was increased, the piezoelectric substrate was warped during the step of heat-treating, and succeeding steps were hindered. Therefore, in addition to this, in consideration of an electrical cost and other factors, the heat treatment temperature of the tantalum electrode film is preferably about 700° C. or less. As is clear from Table 1, in order to produce the effect of decreasing the specific resistance due to the heat treatment, the heat treatment must be performed at a temperature of about 200° C. or more, and the heat treatment is preferably performed at a temperature of about 300° C. or more. Therefore, the heat treatment temperature of the tantalum electrode film is preferably within the range of from about 200° C. to about 700° C., and more preferably, within the range of from about 300° C. to about 700° C.

When comparisons are made between β tantalum and α tantalum in Table 1, α tantalum has a larger effect of improving the specific resistance and the reliability in the humidity test due to the heat treatment. A longer heat treatment time is better, although when the time exceeds a certain period, enhancement is hardly recognized regarding the effect of decreasing the specific resistance and the effect of improving the reliability due to the heat treatment. For example, when the heat treatment temperature is about 350° C., the time that elapses until the effect of improvement due to the heat treatment reaches nearly saturation level and enhancement is not recognized is about 5 hours, although this time varies depending on the heat treatment temperature, and the heat treatment time must be increased with decreases in the heat treatment temperature.

In the aforementioned preferred embodiment, the heat treatment was performed in a vacuum, although similar effects could be also produced by performing heat treatment in an atmosphere not containing oxygen, for example, in an atmosphere of argon, or other suitable atmosphere.

The timing of the heat treatment is not limited to being performed prior to the patterning of the electrode film, and the heat treatment after the electrode film is patterned and the interdigital electrode transducer is formed exhibits the desired advantageous effect. The heat treatments may be performed twice, that is, prior to and after the step of patterning the electrode film.

Table 2 shows the amounts of change in the specific resistance and the results of the humidity test regarding each of the β tantalum electrode films that are not heat-treated, that are heat-treated prior to the patterning of the electrode film, that are heat-treated after the patterning of the electrode film, and that are heat-treated prior to and after the patterning of the electrode film. Herein, the heat treatment was performed in a vacuum at about 400° C. for 3 hours. In the humidity test, changes in the resonant frequency were examined using a resonator in the 400 MHz band after left standing at a temperature of about 85° C. and at a humidity of about 85% for 2000 hours.

TABLE 2

|  | Change in Specific Resistance (%) | Humidity Test (2000 h) Amount of change in Resonant Frequency (ppm) |
| --- | --- | --- |
| Not Heat-Treated | 0 | +27 |
| Heat-Treated Prior to Patterning | −2.7 | +7 |
| Heat-Treated After Patterning | −1.9 | +4 |
| Heat-Treated Twice, Prior to and After Patterning | −3.1 | +1 |

β Ta
Heat treatment: in vacuum, 400° C., 3 hours
Humidity test: 85° C., 85%
Central frequency: 400 MHz band As is shown in Table 2, the heat treatment performed prior to the patterning has a larger effect of decreasing the specific resistance than that of the heat treatment performed after the patterning. Regarding the reliability in the humidity test, however, the heat treatment after the patterning has a larger effect. It is clear that the specific resistance and the reliability can be improved by performing the heat treatments prior to and after the patterning compared to heat treatment that is performed only once.

FIG. 3 shows the measurement results relating to insertion losses relative to the signal with a center frequency of 400 MHz regarding each of the surface acoustic wave filters manufactured using three kinds of electrodes, that is, a tantalum electrode film that is not heat-treated, a tantalum electrode film having an anodized surface, and a tantalum electrode film that is heat-treated in a vacuum at about 400° C. for 3 hours. According to the measurement results, regarding the tantalum electrode film having an anodized surface, the insertion loss of the surface acoustic wave filter is inferior compared to that of the tantalum electrode film that is not heat-treated, although regarding the surface acoustic wave filter heat-treated in a vacuum, the insertion loss is improved.

Figure 4:
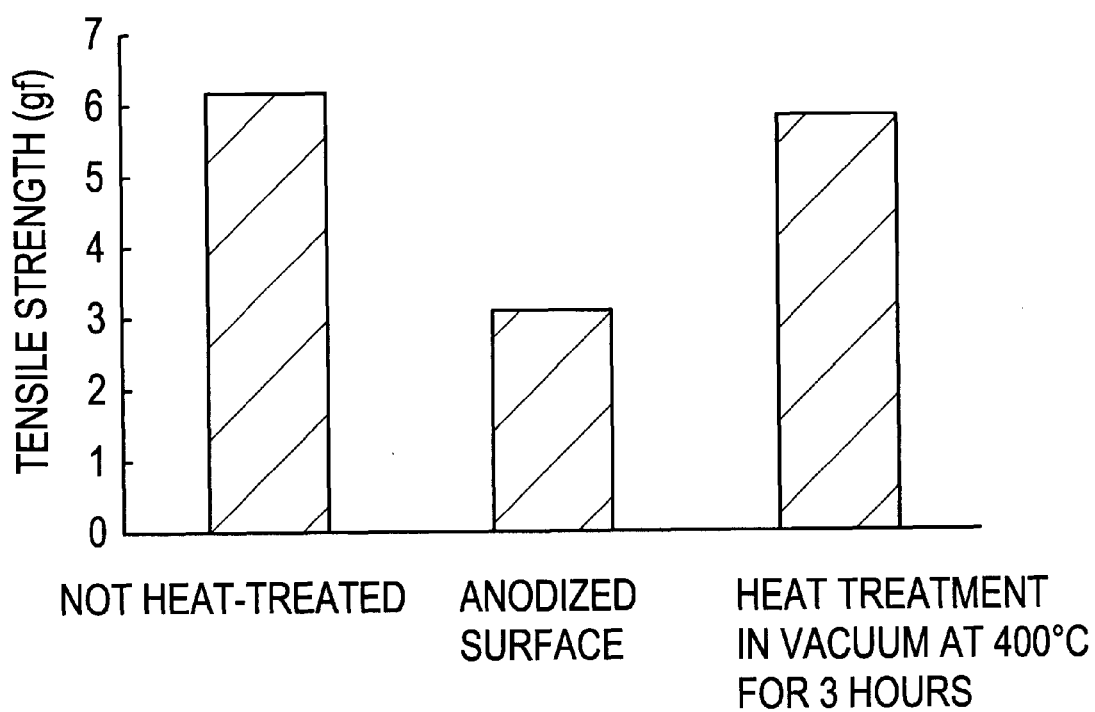
FIG. 4 is a diagram showing measurement results of adhesion strengths between an aluminum wire and each of a tantalum electrode film that is not heat-treated, a tantalum electrode film covered with an anodized film, and a tantalum electrode film that is heat-treated in a vacuum.

Usually, when the surface acoustic wave apparatus is manufactured, a pad portion and a terminal portion of the electrode film are connected with the wire bonding or other suitable element. In this case, the adhesion strength of the wire material and the electrode film must be strong. FIG. 4 shows the measurement results of the adhesion strength (tensile strength) between an aluminum wire of about 25 μm in diameter and each of the tantalum electrode films, that is, a tantalum electrode film that is not heat-treated, a tantalum electrode film having an anodized surface, and a tantalum electrode film that is heat-treated in a vacuum at about 400° C. for 3 hours. As is clear from FIG. 4, the adhesion strength of the tantalum electrode film having the anodized surface was inferior compared to that of the tantalum electrode film that was not heat-treated, although the tantalum electrode film that was heat-treated in a vacuum exhibited a large adhesion strength equivalent to that of the tantalum electrode film that was not heat-treated.

According to various preferred embodiments of the present invention, regarding the surface acoustic wave apparatus using the aforementioned electrode film that is primarily composed of tantalum, the specific resistance of the electrode film is greatly decreased by removing hydrogen occluded in the electrode film, so that the device properties, such as the insertion loss and reliability of the surface acoustic wave apparatus, are significantly improved. In addition, the adhesion strength between the bonding wire and the electrode film are also greatly increased.

While the present invention has been particularly shown and described with reference to preferred embodiments thereof, it will be understood by those skilled in the art that the foregoing and other changes in form and details can be made without departing from the spirit and scope of the invention.

What is claimed is:

1. A method for manufacturing a surface acoustic wave apparatus, comprising the steps of:
    forming an electrode film primarily comprising tantalum on a piezoelectric substrate,
    working said electrode film into a desired shape; and
    heat-treating said electrode film at a temperature within a range from about 200° C. to about 700° C.; wherein the step of heat-treating said electrode film is performed after the step of forming an electrode film.

2. A method for manufacturing a surface acoustic wave apparatus according to claim 1, wherein said step of heat-treating is performed in a vacuum.

3. A method for manufacturing a surface acoustic wave apparatus according to claim 1, wherein said step of heat-treating is performed in an atmosphere not containing oxygen.

4. A method for manufacturing a surface acoustic wave apparatus according to claim 1, wherein said tantalum includes a tantalum.

5. A method for manufacturing a surface acoustic wave apparatus according to claim 1, wherein said step of heat-treating is performed prior to said step of working said electrode film.

6. A method for manufacturing a surface acoustic wave apparatus according to claim 1, further comprising the step of evaluating properties of said surface acoustic wave apparatus.

7. A method for manufacturing a surface acoustic wave apparatus according to claim 1, wherein said step of heat-treating is performed between said step of working said electrode film and said step of evaluating properties of said surface acoustic wave apparatus.

8. A method for manufacturing a surface acoustic wave apparatus according to claim 1, wherein the piezoelectric substrate is made of one of $LiTaO_3$, $LiNbO_{3a}$, $Li_2B_4O_7$, quartz, and piezoelectric ceramic materials.

9. A method for manufacturing a surface acoustic wave apparatus according to claim 1 wherein the electrode film is formed over the entire surface of the piezoelectric substrate.

10. A method for manufacturing a surface acoustic wave apparatus according to claim 1, wherein the electrode film has a single layer structure.

11. A method for manufacturing a surface acoustic wave apparatus according to claim 1, wherein the electrode film has a multiple layer structure.

12. A method for manufacturing a surface acoustic wave apparatus according to claim 1, wherein the electrode film includes a tantalum film and another metal film.

13. A method for manufacturing a surface acoustic wave apparatus according to claim 1, wherein the step of heat treating is performed at a temperature of about 400° C., for a treatment time of approximately 3 hours, and a heat treatment pressure of about 1.0×10.1 Pa.

14. A method for manufacturing a surface acoustic wave apparatus according to claim 1, wherein said step of heat-treating is performed after said step of working said electrode film.

15. A method for manufacturing a surface acoustic wave apparatus according to claim 1, wherein said step of heat-treating is performed at least twice.

16. A method for manufacturing a surface acoustic wave apparatus according to claim 1, wherein said step of heat-treating is performed before and after said step of working said electrode film.

17. A method for manufacturing a surface acoustic wave apparatus, comprising the steps of:
   forming an electrode film primarily composed of tantalum on a piezoelectric substrate in a vacuum;
   working said electrode film into a desired shape; and
   heat-treating said electrode film at a temperature within a range from about 300° C. to about 700° C.; wherein the step of heat-treating said electrode film is performed after the step of forming an electrode film.

18. A method for manufacturing a surface acoustic wave apparatus according to claim 17, wherein said tantalum includes a tantalum.

19. A method for manufacturing a surface acoustic wave apparatus according to claim 17, wherein said step of heat-treating is performed prior to said step of working said electrode film.

20. A method for manufacturing a surface acoustic wave apparatus according to claim 17, further comprising the step of evaluating properties of said surface acoustic wave apparatus, wherein said step of heat-treating is performed between said step of working said electrode film and said step of evaluating properties of said surface acoustic wave apparatus.

21. A method for manufacturing a surface acoustic wave apparatus according to claim 17, wherein the electrode film includes a tantalum film and another metal film.

* * * * *